United States Patent
Sun

(10) Patent No.: US 11,362,302 B2
(45) Date of Patent: Jun. 14, 2022

(54) ARRAY SUBSTRATE, MANUFACTURING METHOD THEREOF AND DISPLAY PANEL

(71) Applicant: KUNSHAN GO-VISIONOX OPTO-ELECTRONICS CO., LTD., Kunshan (CN)

(72) Inventor: Zhengshang Sun, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 609 days.

(21) Appl. No.: 16/324,661

(22) PCT Filed: Apr. 2, 2018

(86) PCT No.: PCT/CN2018/081499
§ 371 (c)(1),
(2) Date: Feb. 11, 2019

(87) PCT Pub. No.: WO2019/029169
PCT Pub. Date: Feb. 14, 2019

(65) Prior Publication Data
US 2021/0336197 A1    Oct. 28, 2021

(30) Foreign Application Priority Data
Aug. 9, 2017   (CN) .......................... 201710676914.3

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3276* (2013.01); *H01L 51/56* (2013.01); *H01L 2227/323* (2013.01)

(58) Field of Classification Search
CPC . H01L 51/5253; H01L 27/3276; H01L 51/56; H01L 2227/323; H01L 21/08;
(Continued)

(56) References Cited

U.S. PATENT DOCUMENTS

2007/0170846 A1*  7/2007  Choi ................... H01L 51/5246
                                                    313/504
2012/0146041 A1    6/2012  Han et al.
(Continued)

FOREIGN PATENT DOCUMENTS

CN    101009309 A    8/2007
CN    101009314 A    8/2007
(Continued)

OTHER PUBLICATIONS

Chinese Office Action dated Sep. 7, 2020, in connection with corresponding CN Application No. 201710676914.3 (13 pp., including machine-generated English translation).
(Continued)

*Primary Examiner* — Ermias T Woldegeorgis
(74) *Attorney, Agent, or Firm* — Maier & Maier, PLLC

(57) ABSTRACT

An array substrate, a manufacturing method thereof and a display panel. After a metal layer is formed on a substrate, a protective layer is formed on the metal layer.

20 Claims, 3 Drawing Sheets

(58) Field of Classification Search
CPC ..... H01L 27/1244; H01L 27/32; H01L 33/44; H01L 51/0031; H01L 51/5246; H01L 27/1214; H01L 27/1259; H01L 27/12
See application file for complete search history.

(56) References Cited

U.S. PATENT DOCUMENTS

| | | | |
|---|---|---|---|
| 2012/0212698 A1* | 8/2012 | Lee | G02F 1/1341 349/138 |
| 2016/0293883 A1 | 10/2016 | Hong et al. | |
| 2016/0357056 A1 | 12/2016 | Kang | |
| 2017/0098797 A1 | 4/2017 | Eom et al. | |
| 2017/0141349 A1* | 5/2017 | Kwak | H01L 51/56 |
| 2018/0331320 A1 | 11/2018 | Su et al. | |

FOREIGN PATENT DOCUMENTS

| | | | |
|---|---|---|---|
| CN | 101711438 A | 5/2010 | |
| CN | 102893700 A | 1/2013 | |
| CN | 103309106 A | 9/2013 | |
| CN | 104638201 A | 5/2015 | |
| CN | 104834143 A | 8/2015 | |
| CN | 105468202 A | 4/2016 | |
| CN | 105955542 A | 9/2016 | |
| CN | 106876328 A | 6/2017 | |
| EP | 1811571 A2 * | 7/2007 | ......... H01L 51/5246 |
| JP | 2000030618 A * | 1/2000 | |
| JP | 2012-177927 A | 9/2012 | |
| JP | 2014-044936 A | 3/2014 | |
| KR | 100759667 B1 | 9/2007 | |
| KR | 1020140016170 A | 2/2014 | |
| TW | 201706385 A | 2/2017 | |
| TW | 201707201 A | 2/2017 | |

OTHER PUBLICATIONS

International Search Report dated Jun. 29, 2018 in corresponding International application No. PCT/CN2018/081499; 6 pages including Partial English-language translation.
Taiwanese Office Action dated Nov. 15, 2018, in connection with corresponding TW Application No. 107114046; 8 pages including Partial English-language translation.
Extended European Search Report dated Jun. 29, 2020 in corresponding European Application No. 18842919.5; 6 pages.
Office Action dated Sep. 1, 2020 in corresponding Japanese Application No. 2019-562455; 6 pages.
Korean Office Action dated Dec. 23, 2020, in connection with corresponding KR Application No. 10-2019-7021405 (11 pp., including machine-generated English translation).
Chinese Office Action dated Feb. 2, 2021, in connection with corresponding CN Application No. 201710676914.3 (17 pp., including machine-generated English translation).
Office Action dated Mar. 13, 2020, in corresponding Chinese Application No. 201710676914.3; 14 pages.

* cited by examiner

ARRAY SUBSTRATE, MANUFACTURING METHOD THEREOF AND DISPLAY PANEL

TECHNICAL FIELD

The present disclosure relates to the field of panel display, in particular to an array substrate, a manufacturing method thereof and a display panel.

BACKGROUND

A display panel has a display area (or active area, AA area) and a non-display area. In the display area, a plurality of pixels are configured to form a pixel array, while in the non-display area, a plurality of metal layers are disposed to form peripheral lines. Each pixel generally includes at least a thin film transistor and a pixel electrode connected to the thin film transistor, and each pixel is surrounded by two adjacent scanning lines and two adjacent data lines. These scanning lines and data lines extend from the display area to the non-display area, and are electrically connected to a driving chip via the peripheral lines of the non-display area, thus realizing the normal work of the display panel. A fan-out line is formed by the convergence of the peripheral lines from one end connecting the scanning line and the data line to the area where the driving chip is located. That is, a plurality of peripheral lines have large spacing at the end near the active area and a small spacing at the end near the driving chip, thus forming a fan shape substantially.

Through research, the applicant found that Metal Crack is a common phenomenon in fan-out lines, especially metal lines, leading to bright traces in the display panel eventually, which has a great impact on the yield of the display panel. Therefore, how to reduce or even avoid the occurrence of metal cracks is a technical problem needs to be solved urgently by those skilled in the art.

SUMMARY

The purpose of the present disclosure is to provide an array substrate, a method for manufacturing the same, a display panel and a method for manufacturing the same, which can reduce the occurrence rate of metal cracks and improve the image quality of the display panel.

In order to realize the above-mentioned purpose, the present disclosure provides an array substrate, including: a substrate; a metal layer located on the substrate; and a protective layer covering the metal layers.

Optionally, the material of the protective layer is one of or a combination of silicon nitride, silicon oxide and silicon oxynitride.

Optionally, the substrate includes a package area and the protective layer covers the metal layers in the package area.

Optionally, at least a portion of a surface of the protective layer in the package area opposite to the metal layers is a concave surface, a convex surface or a concave-convex surface.

Optionally, the concave surface or the convex surface is one of or a combination of two or more of a cylinder, a cone, a circular truncated cone and a hemisphere, and the concave-convex surface is formed by the concave surface and the convex surface which are connected in an interlaced manner or are distributed at an interval in an interlaced manner.

Correspondingly, the present disclosure further provides a method for manufacturing an array substrate, including:

providing a substrate, and forming at least one metal layer on the substrate; and forming a protective layer, the protective layer covering the metal layer.

Optionally, the substrate includes a package area; and the protective layer covers the metal layer in the package area.

Optionally, the substrate includes a display area and a non-display area, and the package area is located in the non-display area; the metal layer is formed both in the non-display area and the display area; and the protective layer is formed both in the non-display area and the display area, and the method further includes removing a portion of the protective layer corresponding to a position of a contact hole in the display area to expose the contact hole.

Optionally, the substrate includes a display area and a non-display area, the metal layer includes a plurality of sub-layers formed in the non-display area, the array substrate further includes a plurality of dielectric layers disposed between the plurality of sub-layers, and the plurality of sub-layers are fan-out lines, configured for transmitting electrical signals provided by a driving chip located in the display area.

Correspondingly, the present disclosure further provides a display panel. The display panel includes an array substrate and a glass cover plate, the array substrate includes: a substrate; a metal layer located on the substrate; and a protective layer covering the metal layer, where a package area of the array substrate or the glass cover plate is coated with a frit to package the array substrate and the glass cover plate.

Compared with the prior art, in the array substrate, the manufacturing method thereof and the display panel provided in the present disclosure, since a protective layer is formed on the metal layer after the metal layer is formed on the substrate, the protective layer can protect the metal layer and avoid the damage to the metal layer caused by subsequent laser irradiation of the frit in the display panel, thereby reducing the occurrence rate of metal cracks and advantageously improving the yield of the display panel.

Further, since at least part of the surface of the protective layer in the package area opposite to the metal layers is a concave surface, convex surface or concave-convex surface and the frit is formed on the surface, the bonding force between the frit and the protective layer can be improved.

DETAILED DESCRIPTION

A display panel, such as an OLED (Organic Light-Emitting Diode) display panel generally includes an array substrate and a glass cover plate which are provided oppositely. The display panel includes a display area and a non-display area, and a package area is provided in the non-display area and is used to package the array substrate and the glass cover plate by being coated with a frit.

Figure 1:
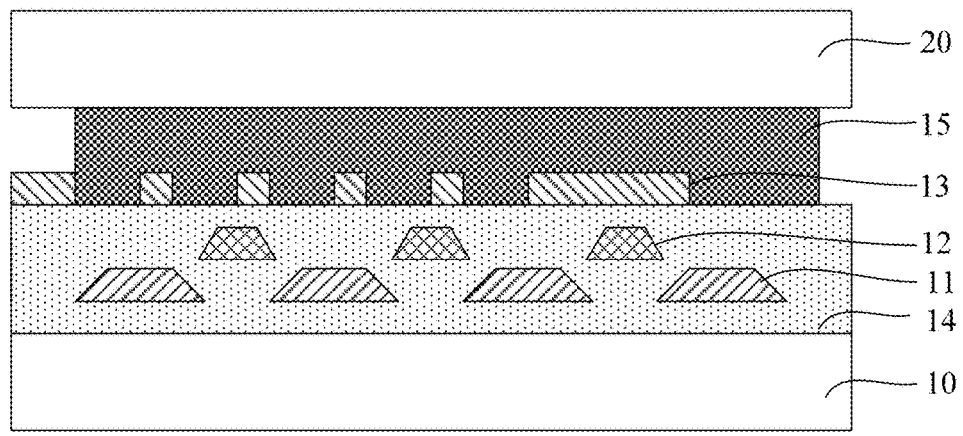
FIG. 1 is a partial structural schematic diagram of a non-display area of a display panel.

As shown in FIG. 1, it is a partial structural schematic diagram of a non-display area of a display panel. As shown in FIG. 1, the display panel includes a substrate 10 and a glass cover plate 20 which are provided oppositely. In the non-display area, a plurality of metal layers are formed on the substrate 10. In FIG. 1, only three metal layers are shown, i.e., a bottom metal layer 11, a middle metal layer 12 and a top metal layer 13. The three metal layers are separated from each other by dielectric layers 14, and the top metal layer 13 in the package area is directly coated with a frit 15, and then the substrate 10 and the glass cover plate 20 are packaged to form a display panel. The metal layers such as the bottom metal layer 11, the middle metal layer 12 and the top metal layer 13 formed in the non-display area belong to fan-out lines, and are used for connecting a driving chip to a data line or a scanning line in the display area, and transmitting electrical signals provided by the driving chip to the data line or the scanning line.

In order to package the substrate 10 and the glass cover plate 20 well, a solution of an embodiment of the present disclosure is as follows: providing a substrate; forming at least one metal layer on the substrate; and forming a protective layer, the protective layer covering the metal layer. The protective layer can protect the metal layer and avoid damaging the metal layer when a glass frit in the display panel is subsequently irradiated by laser (for example, to avoid cracks in the metal layer in a direction perpendicular to the forwarding direction of laser), thus reducing the occurrence of metal cracks. The applicant also unexpectedly found that this method also reduces the rejection rate of bright traces in the display panel. This is because the damage or crack of the metal layer may cause a data line or a scanning line in the display area unable to receive a signal or the receiving inaccurate signals, resulting in bright traces on the display panel.

In order to make the contents of the present disclosure clearer and easier to understand, the contents of the present disclosure will be further described below with reference to the drawings. Of course, the present disclosure is not limited to the specific embodiments, and general substitutions well known to those skilled in the art are also fall within the protection scope of the present disclosure.

Secondly, the present disclosure is described in detail by means of schematic diagrams. When the embodiments of the present disclosure are described in detail, for illustration purposes, the schematic diagrams are not enlarged locally in accordance with the general scale and should not be regarded as limitations to the present disclosure.

Figure 2:
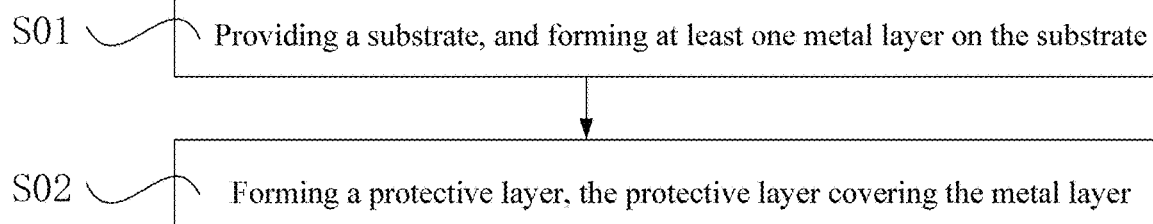
FIG. 2 is a flowchart of a method for manufacturing an array substrate provided by an embodiment of the present disclosure.

Please refer to FIG. 2, it is a flowchart of a method for manufacturing an array substrate provided by an embodiment of the present disclosure. As shown in FIG. 2, the present disclosure provides a method for manufacturing an array substrate, including the following steps:

step S01: providing a substrate, and forming at least one metal layer on the substrate; and step S02: forming a protective layer, the protective layer covering the metal layer.

Figure 3:
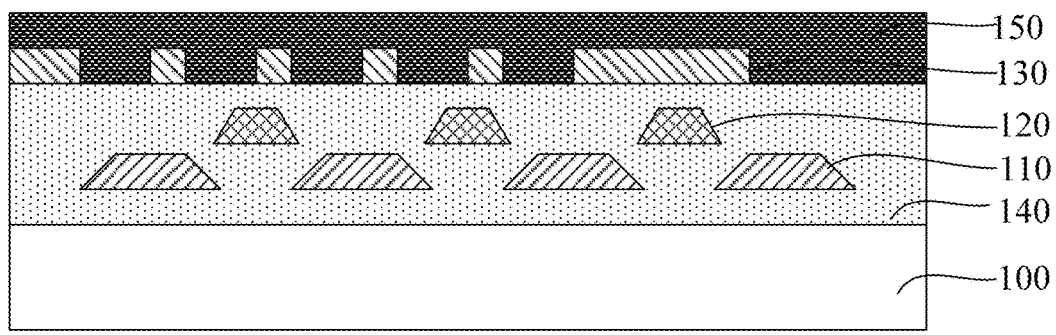
FIG. 3 is a partial structural schematic diagram of a non-display area of an array substrate provided by an embodiment of the present disclosure.

FIG. 3 is a partial structural schematic diagram of a non-display area of an array substrate provided by an embodiment of the present disclosure. Please refer to FIG. 2 in combination with FIG. 3, the method for manufacturing the array substrate provided by the present disclosure is described in detail as follows:

In step S01, the substrate 100 is provided. In this embodiment, the substrate 100 includes a display area and a non-display area, the non-display area surrounds the display area, and FIG. 3 only shows a portion of the non-display area including a package area. Of course, in other embodiments, the non-display area and the display area may also be located on different surfaces of the substrate. For example, the non-display area is located on the back surface of the substrate and does not occupy the area of the display area, so as to improve a resolution and achieve a narrow frame or no frame. The present disclosure does not limit this.

The substrate 100 may be made of a transparent material, such as glass, quartz, silicon wafer, polycarbonate, poly (methyl methacrylate) or metal foil. The substrate 100 may be a rigid substrate or a flexible substrate. The selection and pretreatment of the substrate 100 are familiar by those skilled in the art, and thus are not described in detail. The display area is subsequently used for forming a scanning line, a data line, a transistor switch or a pixel electrode on the substrate 100, and the non-display area is subsequently used for forming a fan-out line on the substrate 100, to connect the scanning line, the data line and the like of the display area to the driving chip.

The non-display area further includes a package area, and the package area is coated with a frit after the array substrate is formed, for packaging the array substrate and the glass cover plate to form a display panel. A fan-out line is also provided in the package area. In an embodiment, the package area is annular and surrounds the display area. FIG. 3 only shows a cross-sectional diagram of a portion of the non-display area including the package area.

Next, at least one metal layer is formed on the substrate 100. In this embodiment, at least one metal layer is formed in the non-display area of the substrate 100. Preferably, three metal layers, i.e., a bottom metal layer 110, a middle metal layer 120 and a top metal layer 130 are formed in the non-display area of the substrate 100. In other embodiments, there may be two, four or more metal layers, depending on the actual requirements of the array substrate. The present disclosure does not limit this.

Preferably, while a plurality of metal layers are formed in the non-display area of the substrate 100, a plurality of metal film layers are formed in the display area of the substrate 100, such as a data line, a scanning line or a pixel electrode. That is, while a data line, a scanning line, a pixel electrode or other metal film layers are formed in the display area, a plurality of metal layers are formed in the non-display area. Thus, the material of the plurality of metal layers are depended on the material of the data line, the scanning line, the pixel electrode or other metal film layers formed simultaneously in the display area. The materials of the plurality of metal layers may be different from each other or identical. The material of the plurality of metal layers may include, but not limited to, copper, aluminum, nickel, magnesium, chromium, molybdenum, tungsten and alloys thereof. Of course, the plurality of metal layers may also be formed in the non-display area of the substrate 100 separately.

The plurality of metal layers are separated by dielectric layers 140, and the dielectric layers 140 between different metal layers are formed in different steps, but all configured to separate the metal layers. Therefore, no distinction is made in FIG. 3. It can be understood that the formation of the dielectric layers 140 are also synchronized with the formation of the insulating layers in the display area. For example, if any one of the dielectric layers 140 is formed in the process of forming a gate insulating layer, a interlayer insulating layer and the like of a transistor, the material of the dielectric layer is the same as that of the gate insulating layer and the interlayer insulating layer formed at the same time. The material of the dielectric layers 140 includes, but not limited to, oxides or nitrides. Of course, the materials of the dielectric layers between different metal layers may be different. It can be understood that the dielectric layer 140 may also be formed separately between the plurality of metal layers. That is, the plurality of metal layers and the dielectric layers formed in the non-display area may be formed simultaneously with the metal layers or the insulating layers in the display area, or may also be formed separately.

A method for forming the plurality of metal layers and the dielectric layers in the non-display area of the substrate 100 is briefly described below, including the following steps:

Firstly, a first dielectric layer is formed on the substrate 100, preferably by chemical vapor deposition, such as High Density Plasma Chemical Vapor Deposition (HDPCVD), Low Pressure Chemical Vapor Deposition (LPCVD) or Ultra-High Vacuum Chemical Vapor Deposition (UHVCVD) and the like. Then, a bottom layer of metal is formed on the first dielectric layer, preferably by sputtering; and then the bottom layer of metal is patterned by adopting a patterning process including, for example, photoresist spin-coating, exposure, development and etching processes, to form a bottom metal layer 110. Then, the above-mentioned steps are repeated to form a second dielectric layer on the bottom metal layer 110, the second dielectric layer covering the bottom metal layer 110. Then middle metal is formed on the second dielectric layer, and is etched into a middle metal layer 120. Then a third dielectric layer is formed on the middle metal layer 120, the third dielectric layer covering the middle metal layer 120. Finally, a top layer of metal is formed on the third dielectric layer, and is etched into a top metal layer 130. The first dielectric layer, the second dielectric layer and the third dielectric layer form the dielectric layers 140 shown in FIG. 3. It can be understood that the metal layers are not limited to three layers mentioned above, but may include only two metal layers, or more than four metal layers. Correspondingly, the number of the dielectric layers may also be adaptively changed according to the number of the metal layers.

In step S02, a protective layer is formed, and the protective layer covers the metal layers. In this embodiment, the protective layer 150 is formed on the top metal layer 130 of the plurality of metal layers in the non-display area. The protective layer 150 may be a single-layer structure or a stack structure. The material of the protective layer 150 includes, but not limited to, silicon nitride, silicon oxide or silicon oxynitride. Of course, the material of the protective layer 150 may also be other materials known to those skilled in the art, which can prevent the metal layers from being damaged by laser irradiation used in subsequent packaging. Since silicon nitride, silicon oxide or silicon oxynitride is a conventional material in the art, it can be used as a preferred material in this embodiment. The thickness of the protective layer 150 is preferably 2000 Å to 4000 Å, and most preferably, the thickness of the protective layer 150 is 3000 Å. The protective layer 150 with this thickness can prevent the metal layers from being damaged by laser irradiation, and will not affect the thickness of the display panel formed finally.

In this embodiment, the protective layer 150 is formed by chemical vapor deposition. Conditions for forming the protective layer 150 are preferably as follows: chamber temperature is 350° C. to 400° C., chamber pressure is 900 mtorr to 1100 mtorr, and film forming time is 350 s to 450 s, most preferably, chamber temperature is 385° C., chamber pressure is 1000 mtorr, and film forming time is 400 s.

Preferably, while a protective layer 150 is formed on the top metal layer 130 in the non-display area, a protective layer is also formed in the display area. That is, protective layers are formed simultaneously on the entire substrate 100, and the protective layer at the position where a contact hole is provided in the display area is etched to expose the contact hole, so as to avoid the influence of the protective layer on the connection of the display area. The film layer before the formation of the protective layer in the display area is not limited. For example, while a data line is formed in the display area, a top metal layer is formed in the non-display area, then, if a protective layer is formed directly, a protective layer is formed on the data line in the display area, and if a protective layer needs to be further formed in the display area after other film layers (e.g. scanning lines) are formed on the data line, a protective layer is formed on the scanning lines in the display area.

The protective layer 150 is formed on the top metal layer 130, the protective layer 150 is used for protecting the metal layers and avoiding the influence of laser on the metal layers during subsequent laser irradiation, thereby avoiding the occurrence of metal cracks, reducing the occurrence rate of metal cracks, and ultimately improving the yield of the display panel.

Figure 4:
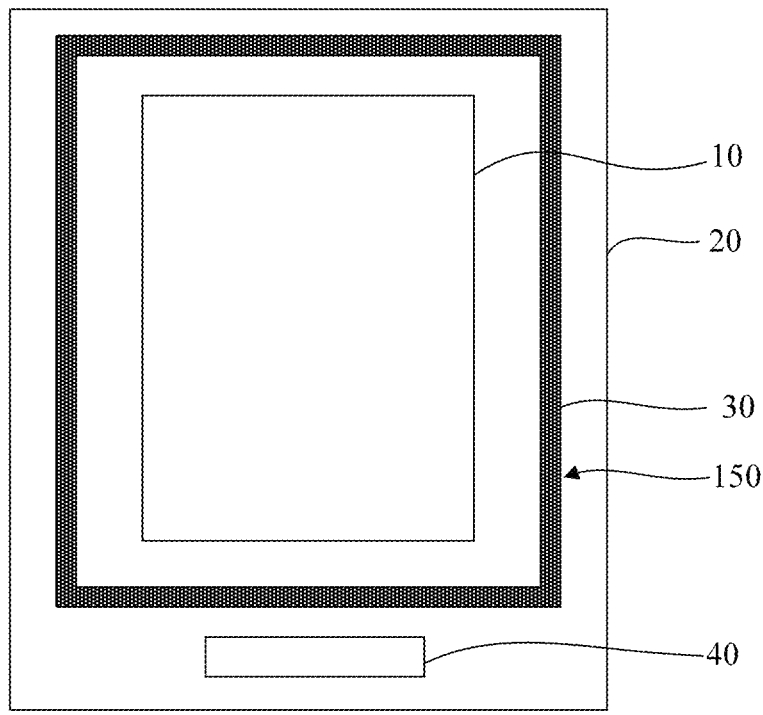
FIG. 4 is a top view of an array substrate provided by an embodiment of the present disclosure.

Then, the protective layer 150 may also be patterned. Preferably, the protective layer 150 may be etched and only the protective layer 150 on the top metal layer 130 in the package area is retained (as shown in FIG. 3). FIG. 4 is a top view of an array substrate provided by an embodiment of the present disclosure. Please refer to FIG. 4, the array substrate includes a display area 10 and a non-display area 20 surrounding the display area 10. A package area 30 and a binding area 40 are provided in the non-display area 20. The package area 30 is annular and surrounds the display area 10, and the binding area 40 is located in the non-display area 20 between the package area 30 and the edge of one side of the array substrate. Preferably, the protective layer 150 is formed only in the package area 30. In this way, not only can the occurrence of metal cracks be reduced, but also the electrostatic defects caused by the formation of the protective layer in the remaining areas of the non-display area, such as the electrostatic defects caused by of the fact that a detection circuit (CT circuit) in the binding area 40 is covered by the protective layer, are avoided. Of course, the protective layer 150 in the remaining areas of the non-display area may not be etched. That is, the protective layer 150 is located in the whole non-display area. In this way, the occurrence of bright traces can be reduced, but the occurrence of electrostatic defects will be increased. That is, in addition to the formation of the protective layer 150 above the package area reducing the occurrence of metal cracks, the formation of the protective layer at the remaining positions of the non-display area can reduce the occurrence of bright traces.

When the protective layer 150 is etched, the protective layer of the display area may also be etched at the same time. That is, after the protective layer is formed, the protective layer at the position where the contact hole is located in the display area needs to be etched to expose the contact hole. In the etching process, the protective layer in the remaining areas except the package area in the non-display area may be removed by etching, or all protective layers in the display area may be etched, depending on the actual situation.

Specifically, a photoresist layer is coated onto the protective layer 150 and exposed by a mask. For positive photoresist, the mask may only expose the contact hole in the display area, or expose the entire display area, or expose other areas except the package area in the non-display area, or expose all areas except the package area. The used mask is determined according to the specific situation. Then, the exposed photoresist layer is developed to form a patterned photoresist layer. Then, the protective layer is etched by using the patterned photoresist layer as a mask. Finally, the remaining photoresist layer is peeled off to form a required protective layer pattern.

It needs be noted that, in the process of etching the protective layer by using the patterned photoresist as the mask, other layers under the protective layer should be prevented from being damaged. For example, the top metal layer under the protective layer should be prevented from being damaged when the protective layer in other areas except the package area in the non-display area is etched. To solve this problem, the etching selection ratio can be adjusted, and the appropriate etching selection ratio can be selected to etch the protective layer, so as to ensure a high etching rate to the protective layer, a low etching rate to the other film layers, or the other film layers being not etched. For example, the protective layer is etched by plasma etching, the etching gas includes, but not limited to, mixture of $C_2HF_5$ (pentafluoroethane), $H_2$ (hydrogen) and Ar (argon), and the etching selection ratio of the protective layer to the other film layers is preferably greater than 5:1.

In addition, in the step of etching the protective layer 150, the protective layer 150 in the package area may also be partially etched such that at least a portion of the surface of the protective layer 150 in the package area opposite to the top metal layer 130 is a concave surface, convex surface or concave-convex surface. That is, at least a portion of the surface of the protective layer 150 opposite to the top metal layer 130 is a non-planar surface, ensuring a better bonding force between the frit coated subsequently and the protective layer 150. That is, the bonding force between the frit and the protective layer is increased through the non-planar surface, thereby improving the reliability of the finally formed display panel.

Preferably, the concave surface or convex surface is one or a combination of two or more of a cylinder, a cone, a circular truncated cone and a hemisphere, and the concave-convex surface is formed by the concave surface and the convex surface which are connected in an interlaced manner, or may be formed by the concave surface and the convex surface which are distributed at an interval in an interlaced manner. For example, the concave surface is formed by a plurality of grooves formed in the surface of the protective layer 150. The dimensions and shapes of these grooves may be the same or different. For example, the convex surface is formed by a plurality of protrusions formed on the surface of the protective layer 150. The dimensions and shapes of these protrusions may be the same or different. The concave-convex surface is jointly formed by a plurality of grooves and a plurality of protrusions formed on the surface of the protective layer 150. Similarly, the shapes and sizes of the grooves and protrusions are not limited.

Of course, the protective layer 150 may also be formed only in the package area, thus the protective layer 150 is prevented from being etched, and the production time and cost can be reduced. For example, a mask exposing the package area is fabricated and deposition is performed by using the mask as a mask to form a protective layer, but the precision of the protective layer fabricated by this method is relatively lower. If the product specification is not very high or the capability of the equipment is good, the protective layer may be formed in the package area by adopting the method of the mask plate in combination with the chemical vapor deposition. Of course, whether to etch after a protective layer is formed or to form a protective layer only where it is needed should be determined according to the actual requirements, which is not limited in the present disclosure. Of course, the protective layer may also be formed by adopting other methods known to those skilled in the art.

Finally, the structure as shown in FIG. 4 is formed. After the formation of the protective layer 150, the fabrication of each film layer in the display area of the substrate 100 is completed before packaging. The fabrication method is familiar by those skilled in the art and thus is not described in detail, and finally the fabrication of the array substrate is completed.

Figure 5:
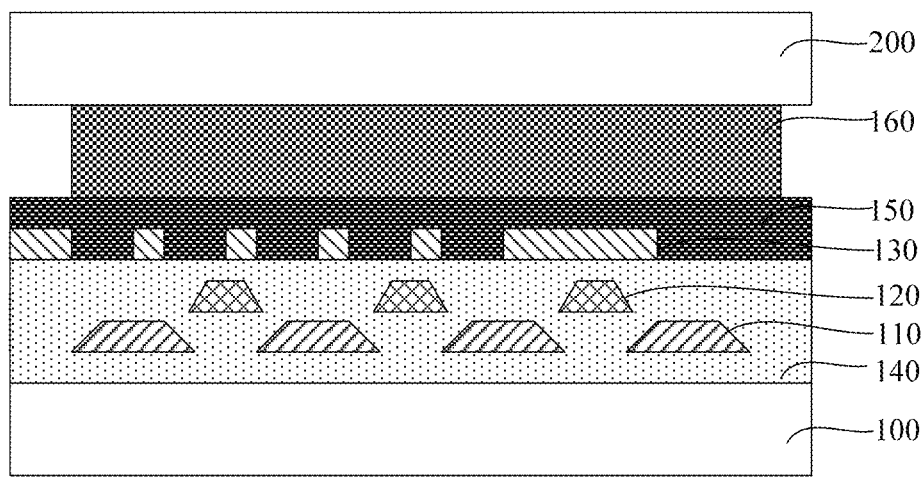
FIG. 5 is a partial structural schematic diagram of a non-display area of a display panel provided by an embodiment of the present disclosure.

Correspondingly, the present disclosure further provides a method for manufacturing a display panel, including the method for manufacturing the array substrate described above. The method for manufacturing the display panel includes:

completing the fabrication of an array substrate, and providing a glass cover plate 200;

coating a frit 160 onto a package area of the array substrate or the glass cover plate 200, and packaging the array substrate and the glass substrate 200. By coating the frit 160, the array substrate and the glass cover plate 200 are packaged to form a display panel, which finally forms a structure as shown in FIG. 5. When the frit 160 is fused by laser irradiation, the protective layer 150 can protect the metal layer, avoiding cracks in the metal layer, reducing the occurrence rate of cracks, and improving the yield of the display panel.

Figure 6:
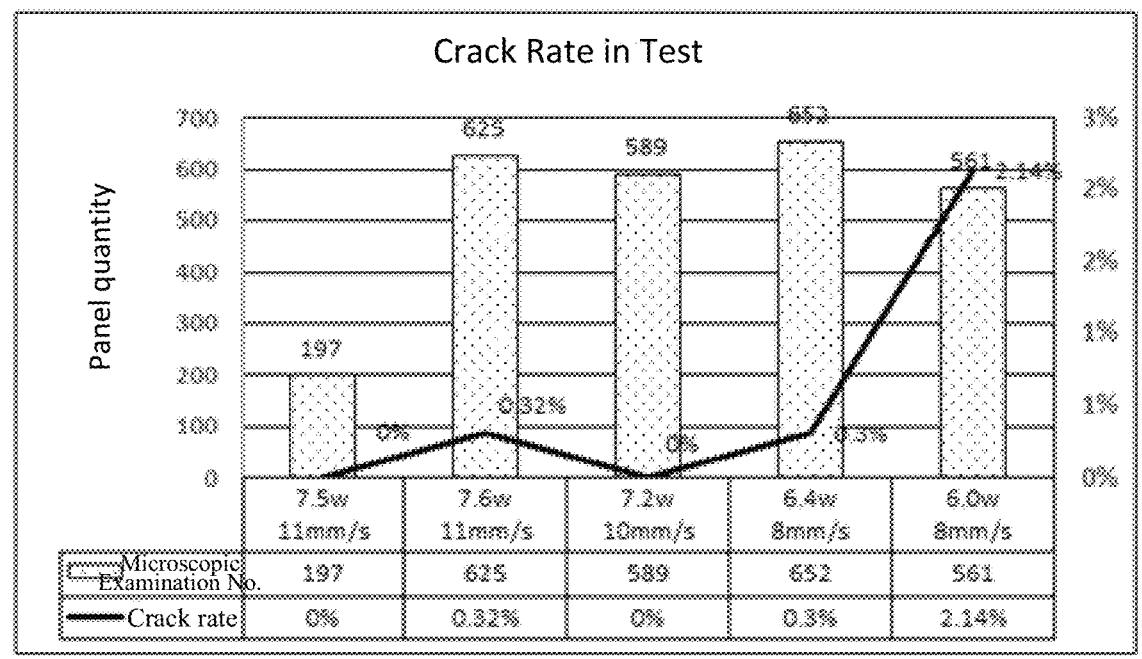
FIG. 6 is a data diagram of metal cracks in a display panel provided by an embodiment of the present disclosure.

Please refer to FIG. 6, it is a data schematic diagram of metal cracks in a display panel provided by an embodiment of the present disclosure. As shown in FIG. 6, taking a display panel of a certain size, such as 5.5 inch, as an example to perform verification, after a protective layer is formed on the top metal layer of the package area, the occurrence rate of cracks is decreased significantly as compared with the previous 20% (no protective layer is formed). It should be pointed out that the row 7.5 W 11 mm/s in the table of FIG. 6 represents the conditions for laser irradiation, in which 7.5 W represents the laser energy and 11 mm/s represents the laser moving speed. From FIG. 6, it can be seen that, based on the formation of the protective layer, adjusting the conditions for laser irradiation can completely avoid the crack phenomenon. Better conditions for laser irradiation are that the laser energy is between 7.2 w and 7.5 w, and the laser moving speed is between 10 mm/s and 11 mm/s.

Please refer to Table 1, it shows reliability results of a display panel provided by an embodiment of the present disclosure. As shown in Table 1, the reliability of the display panel manufactured by the method for manufacturing the array substrate provided by the present disclosure is verified. For example, temperature and humidity action tests being carried out, the temperature is 60° C., the humidity is 90% RH, the test time is 120 H, and an R/G/B dark spot (red/green/blue dark spot) appears on one of 10 display panels when the test is carried out for 60 H. It is found by research that the bad spot is an anode black spot caused by abnormal fabrication of anode or anode etching, which is not related to cracks. The high temperature action test being carried out, the temperature is 60° C., the test time is 120 H, and there is no new abnormality. The high temperature storage test being carried out, the temperature is 70° C., the test time is 120 H, and there is no new abnormality, either. Therefore, it can be determined that the method of forming a protective layer on the top metal layer of the package area can reduce the occurrence rate of cracks and does not cause other abnormalities.

TABLE 1

| Evaluation /N item | Sample Number | Evaluation conditions | Summary of abnormalities | Judgment &basis |
|---|---|---|---|---|
| 1 Temperature and humidity action test | 10 pcs | 60° C., 90% RH, 120 H | 60 H, 1 pcs is newly added with an R/G/b dark spot | Qualified The defect is not related to the verification purpose. |
| 2 High temperature action test | 10 pcs | 60° C., 120 H | No abnormality is newly added. | Qualified |
| 3 High temperature storage test | 10 pcs | 70° C., 120 H | No abnormality is newly added | Qualified |

Note:
the dark spot is an anode black spot.
Overall judgment conclusion:
■ Qualified
☐ Unqualified
☐ To be judged by test application unit
☐ Others Correspondingly, the present disclosure further provides an array substrate, which is manufactured by adopting the method for manufacturing the array substrate. The array substrate includes:
a substrate;
a metal layer located on the substrate; and
a protective layer covering the metal layer.

Specifically, please refer to FIG. 3, the array substrate includes: a substrate 100 including a display area and a non-display area (only part of the non-display area containing a package area is shown in FIG. 3), and a plurality of metal layers located in the non-display area of the substrate 100, preferably three layers, i.e. a bottom metal layer 110, a middle metal layer 120 and a top metal layer 130; further includes dielectric layers 140 located between the three metal layers, surrounding the bottom metal layer 110 and the middle metal layer 120, and located between the bottom metal layer 110 and the substrate 100; and further includes a protective layer 150 on the top metal layer 130.

In this embodiment, the protective layer 150 is located only above the top metal layer 130 in the package area. In other embodiments, the protective layer 150 may also be located in other areas except the package area in the non-display area, or the protective layer 150 may also be located in the display area. Of course, the protective layer 150 at the position where a contact hole is provided in the display area needs to be removed to avoid affecting the contact of the display area.

Correspondingly, the present disclosure further provides a display panel, which is manufactured by adopting the method for manufacturing the display panel. The display panel includes:
an array substrate including a substrate; a metal layer located on the substrate; and a protective layer covering the metal layer;
a frit located on the protective layer; and
a glass cover plate located on the frit.

Figure 7:
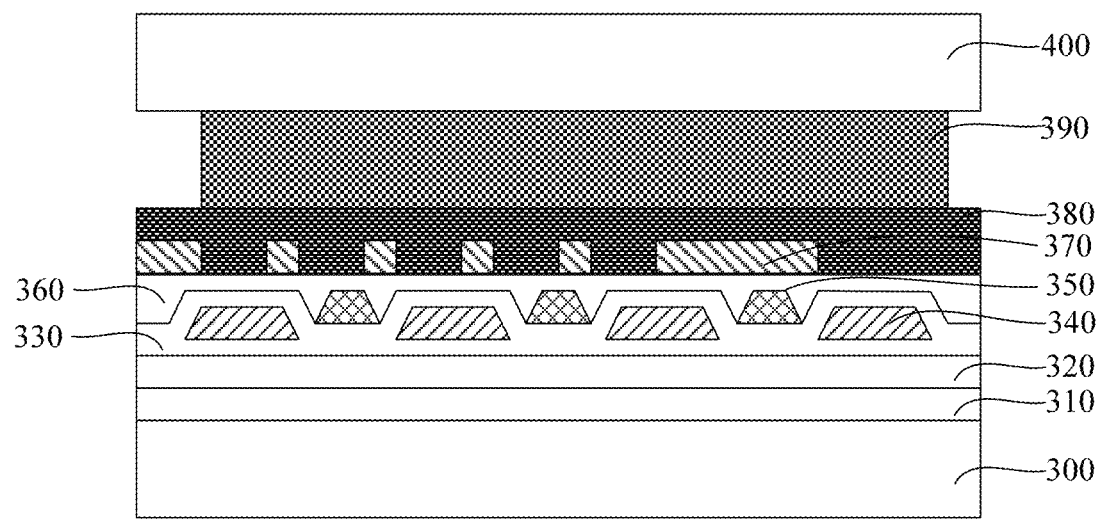
FIG. 7 is a partial structural schematic diagram of a non-display area of a display panel provided by another embodiment of the present disclosure.

Specifically, please refer to FIG. 7, it is a partial structural schematic diagram of a non-display area of a display panel provided by another embodiment of the present disclosure, wherein the metal layer and the protective layer in the non-display area of the array substrate are formed in same steps as the metal layer and the protective layer in the display area.

As shown in FIG. 7, the display panel includes:
an array substrate including: a substrate 300 including a display area and a non-display area (only part of the non-display area containing a package area is shown in FIG. 6); a first dielectric layer 310, a second dielectric layer 320 and a third dielectric layer 330 sequentially located in the non-display area of the substrate 300, a bottom metal layer 340 located in the third dielectric layer, a middle metal layer 350 located on the third dielectric layer 330, a fourth dielectric layer 360 located on the third dielectric layer 330 and the middle metal layer 350, and a top metal layer 370 located on the fourth dielectric layer 360. And the first dielectric layer 310, the second dielectric layer 320, the third dielectric layer 330 and the fourth dielectric layer 360 are all formed in the same steps as the dielectric layers or insulating layers in the display area. The preferred material of the dielectric layers is silicon oxide or silicon nitride, and the array substrate further includes a protective layer 380 located on the fourth dielectric layer 360 and the top metal layer 370;
a frit 390 located on the protective layer 380; and
a glass cover plate 400, the glass cover plate 400 and the array substrate being packaged via the frit 390.

To sum up, in the array substrate, the method for manufacturing the same, the display panel and the method for manufacturing the same provided by the present disclosure, since a protective layer is formed on the metal layer after the metal layers are formed on the substrate, the protective layer can protect the metal layers and avoid damaging the metal layer when a glass frit in the display panel is subsequently irradiated by lase in the display panel, thereby reducing the occurrence rate of metal cracks and advantageously improving the yield of the display panel.

Further, since at least a portion of the surface of the protective layer in the package area opposite to the metal layers is a concave surface, convex surface or concave-convex surface, when the frit is formed on the surface, the bonding force between the frit and the protective layer can be improved.

The above descriptions are only descriptions of preferred embodiments of the present disclosure, and do not limit the scope of the present disclosure. Any variation or modification made by those skilled in the art according to the contents disclosed above belongs to the protection scope of the claims.

The invention claimed is:
1. An array substrate, comprising:
a substrate, the substrate comprising a package area;
a metal layer located on the substrate;
a protective layer, which is etched to only retain the protective layer on the metal layer in the package area; and
a frit coated on the package area and located on the protective layer,
wherein the substrate comprises a display area and a non-display area, the metal layer comprises a plurality of layers formed in the non-display area, dielectric layers are disposed between the plurality of layers, the plurality of layers comprise a bottom metal layer, a middle metal layer and a top metal layer which are separated from each other by the dielectric layers, and the top metal layer in the package area is directly coated with the frit.

2. The array substrate according to claim 1, wherein at least a portion of a surface of the protective layer in the package area opposite to the metal layer is a concave surface, a convex surface or a concave-convex surface.

3. The array substrate according to claim 2, wherein the concave surface or the convex surface is one of or a combination of two or more of a cylinder, a cone, a circular truncated cone and a hemisphere, and the concave-convex surface is formed by the concave surface and the convex surface which are connected in an interlaced manner or are distributed at an interval in an interlaced manner.

4. The array substrate according to claim 1, wherein lines of the plurality of layers are fan-out lines, configured for transmitting electrical signals provided by a driving chip located in the display area.

5. The array substrate according to claim 4, wherein the non-display area and the display area are located on different surfaces of the substrate.

6. The array substrate according to claim 1, wherein a material of the protective layer is one or a combination of silicon nitride, silicon oxide and silicon oxynitride.

7. The array substrate according to claim 1, wherein the protective layer has a thickness of from 2000 Å to 4000 Å.

8. The array substrate according to claim 1, wherein the protective layer is formed on the top metal layer of the plurality of metal layers in the non-display area, and wherein the protective layer is a single-layer structure or a stack structure.

9. A method for manufacturing an array substrate, comprising:
  providing a substrate, and forming at least one metal layer on the substrate;
  forming a protective layer, the protective layer covering the metal layer, wherein the substrate comprises a package area and the protective layer is further etched to only retain the protective layer on the metal layer in the package area; and
  coating a frit onto the package area, the frit located on the protective layer,
  wherein the substrate comprises a display area and a non-display area, the metal layer comprises a plurality of layers formed in the non-display area, the plurality of layers comprise a bottom metal layer, a middle metal layer and a top metal layer which are separated from each other by dielectric layers, and the top metal layer in the package area is directly coated with the frit.

10. The method for manufacturing an array substrate according to claim 9, wherein the package area is located in the non-display area;
  the metal layer is formed simultaneously in the non-display area and the display area; and
  the protective layer is formed simultaneously in the non-display area and the display area, and the method further comprises removing a portion of the protective layer corresponding to a position of a contact hole in the display area to expose the contact hole.

11. The method for manufacturing an array substrate according to claim 10, wherein the non-display area and the display area are located on different surfaces of the substrate.

12. The method for manufacturing an array substrate according to claim 9, wherein the protective layer has a thickness of from 2000 Å to 4000 Å.

13. The method for manufacturing an array substrate according to claim 9, wherein the protective layer is etched by plasma etching with an etching gas including mixture of $C_2HF_5$, $H_2$ and Ar, and the etching selection ratio of the protective layer to other film layers is greater than 5:1.

14. A display panel, comprising an array substrate and a glass cover plate, the array substrate comprising:
  a substrate, the substrate comprising a package area;
  a metal layer located on the substrate; and
  a protective layer formed only in the package area and covering the metal layer in the package area,
  wherein the package area of the array substrate is coated with a frit to package the array substrate and the glass cover plate, and the frit is located on the protective layer,
  wherein the substrate comprises a display area and a non-display area, the metal layer comprises a plurality of layers formed in the non-display area, dielectric layers are disposed between the plurality of layers, the plurality of layers comprise a bottom metal layer, a middle metal layer and a top metal layer which are separated from each other by the dielectric layers, and the top metal layer in the package area is directly coated with the frit.

15. The display panel according to claim 14, wherein lines of the plurality of layers are fan-out lines, configured for transmitting electrical signals provided by a driving chip located in the display area.

16. The display panel according to claim 15, wherein the non-display area and the display area are located on different surfaces of the substrate.

17. The display panel according to claim 14, wherein the protective layer has a thickness of from 2000 Å to 4000 Å.

18. The display panel according to claim 17, wherein at least part of a surface of the protective layer in the package area opposite to the metal layer is a concave surface, a convex surface or a concave-convex surface, the concave surface or the convex surface is one of or a combination of two or more of a cylinder, a cone, a circular truncated cone and a hemisphere, and the concave-convex surface is formed by the concave surface and the convex surface which are connected in an interlaced manner or are distributed at an interval in an interlaced manner.

19. The display panel according to claim 14, wherein a material of the protective layer is one or a combination of silicon nitride, silicon oxide and silicon oxynitride.

20. The display panel according to claim 14, wherein the protective layer is formed on the top metal layer of the plurality of metal layers in the non-display area, and wherein the protective layer is a single-layer structure or a stack structure.

* * * * *